(12) United States Patent
Li et al.

(10) Patent No.: US 7,889,771 B2
(45) Date of Patent: Feb. 15, 2011

(54) DRIVING DEVICE AND METHOD

(75) Inventors: Song Li, Hang-Zhou (CN); Shou-Qing Yang, Hang-Zhou (CN); Yin-Long Luo, Hang-Zhou (CN)

(73) Assignee: Asia Optical Co., Inc., Taichung (TW)

( * ) Notice: Subject to any disclaimer, the term of this patent is extended or adjusted under 35 U.S.C. 154(b) by 151 days.

(21) Appl. No.: 11/770,769

(22) Filed: Jun. 29, 2007

(65) Prior Publication Data

US 2008/0019407 A1 Jan. 24, 2008

(30) Foreign Application Priority Data

Jul. 19, 2006 (TW) ................ 95126357 A
Mar. 3, 2007 (TW) ................ 96203551 U

(51) Int. Cl.
*H01S 3/00* (2006.01)

(52) U.S. Cl. .................... 372/38.02; 372/38.01

(58) Field of Classification Search ............ 372/38.02, 372/38.01
See application file for complete search history.

(56) References Cited

U.S. PATENT DOCUMENTS

| | | | | |
|---|---|---|---|---|
| 4,489,415 A | * | 12/1984 | Jones, Jr. ............... | 372/38.03 |
| 5,020,901 A | * | 6/1991 | de Groot ............... | 356/5.1 |
| 5,706,117 A | * | 1/1998 | Imai et al. ............ | 398/197 |
| 2002/0085600 A1 | * | 7/2002 | Jung ..................... | 372/38.02 |
| 2005/0238072 A1 | * | 10/2005 | Uesaka ................. | 372/38.02 |
| 2006/0088070 A1 | * | 4/2006 | Kyougoku et al. ..... | 372/38.02 |

* cited by examiner

*Primary Examiner*—Minsun Harvey
*Assistant Examiner*—Patrick Stafford
(74) *Attorney, Agent, or Firm*—Thomas, Kayden, Horstemeyer & Risley

(57) ABSTRACT

A driving device including a light emitter, a biasing circuit, a light receiver, an automatic control system, and an alternating current (AC) path is disclosed. The light emitter generates an optical signal. The biasing circuit generates a driving signal to activate the light emitter such that the light emitter operates in a working range. The light receiver detects the output power of the optical signal for generating a corresponding electrical signal. The automatic control system adjusts the driving signal according to the corresponding electrical signal such that the output power of the optical signal approaches a preset value. The AC path is coupled between the light emitter and an external signal source for receiving at least one AC modulated signal such that the light emitter generates at least one modulated optical signal.

18 Claims, 3 Drawing Sheets

US 7,889,771 B2

DRIVING DEVICE AND METHOD

BACKGROUND OF THE INVENTION

1. Field of the Invention

The invention relates to a driving device, and more particularly to a driving device for driving a laser diode.

2. Description of the Related Art

Laser diodes (LDs), due to their small size, low cost and ease of use, are widely employed in a variety of fields, such as optical storage, light reading, light communication, and distance measurement. Driving devices are required for driving LDs. Driving device requirements differ by purpose.

FIG. 1 is a chart showing the driving current of the LD relative to the output power of LD at different temperatures. When the driving current exceeds a threshold current $I_{th}$, a laser beam emitted by the LD is an effective laser beam. Additionally, temperature profoundly affects LD output power. At the same current, when temperature is higher, output power is lower.

In the majority of LD applications, such as CDs, DVDs, long distance, middle distance, or short distance measurements, LDs are required for stably emitting a stably laser beam. Thus, LDs require suitable driving devices. A suitable driving device provides a driving current sufficient for the LD to produce an effective laser beam.

BRIEF SUMMARY OF THE INVENTION

A driving device and method are provided. An exemplary embodiment of a driving device comprises a light emitter, a biasing circuit, a light receiver, an automatic control system, and an alternating current (AC) path. The light emitter generates an optical signal. The biasing circuit generates a driving signal to activate the light emitter such that the light emitter operates in a working range. The light receiver detects the output power of the optical signal for generating a corresponding electrical signal. The automatic control system adjusts the driving signal according to the corresponding electrical signal such that the output power of the optical signal approaches a preset value. The AC path is coupled between the light emitter and an external signal source for receiving at least one AC modulated signal such that the light emitter generates at least one modulated optical signal.

An exemplary embodiment of a driving device is described in the following. A driving signal is generated to activate a light emitter such that the light emitter operates in a working range and generates an optical signal. The output power of the optical signal is detected for generating a corresponding electrical signal. The driving signal is adjusted according to the corresponding electrical signal such that the output power of the optical signal approaches a preset value. An alternating current (AC) path is utilized to receive at least one AC modulated signal such that at least one modulated optical signal is generated by the light emitter. The AC path is coupled between the light emitter and an external signal source.

Another exemplary embodiment of a driving device drives a laser diode and comprises a light emitter, a biasing circuit, a light receiver, and an automatic control system. The light emitter generates an optical signal. The biasing circuit is coupled to the light emitter for generating a driving signal such that the light emitter is activated by the driving signal and operates in a working range. The light receiver detects the output power of the optical signal for generating a corresponding electrical signal. The automatic control system is coupled between the light receiver and the biasing circuit. The automatic control system adjusts a current passing through the light emitter according to the corresponding electrical signal and comprises a voltage divider and an integral loop. The voltage divider modulates a biasing voltage of the light emitter according to a first control signal. The integral loop is coupled to an output terminal of the voltage divider.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

With the development of laser beam generator technology, a handheld phase measurement device utilizing a laser beam to measure distance has come into use and is widely applied to building, traffic, topographical surveying, and indoor decoration.

Generally, a light emitter is required in the phase measurement device for emitting a laser beam to measuring point (an object). Because the laser beam is reflexed and received by a receiver within the phase measurement device, the distance between the phase measurement device and the measuring point is determined according to a phase change between the laser beam and the received result.

A detector within the phase measurement device is a PIN photo diode or an avalanche photo diode (APD) for transforming the received result from optical signals to electronic signals. The ordinary phase measurement device measures phase to determine distance. In the phase measurement device, a mixing frequency is added to the electronic signals for generating a low frequency measuring signal. The phase of the measuring signal is compared with the phase of a reference signal. The distance between the phase measurement device and the measuring point is determined according to the phase difference between the phase of the measuring signal and the phase of a reference signal.

Figure 1:
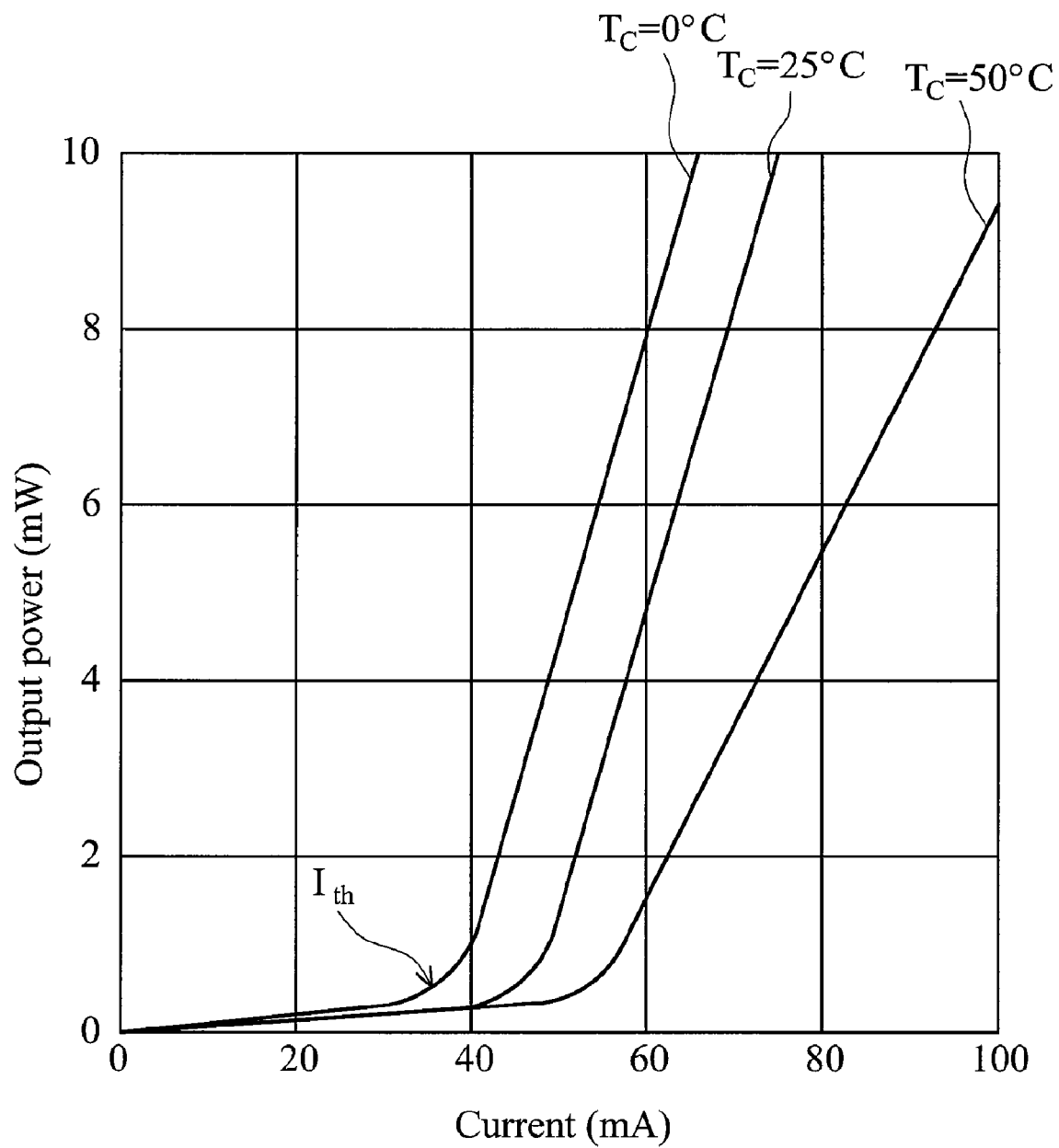
FIG. 1 is a chart showing the current of the LD relative to the output power of LD at different temperatures.
Figure 2:
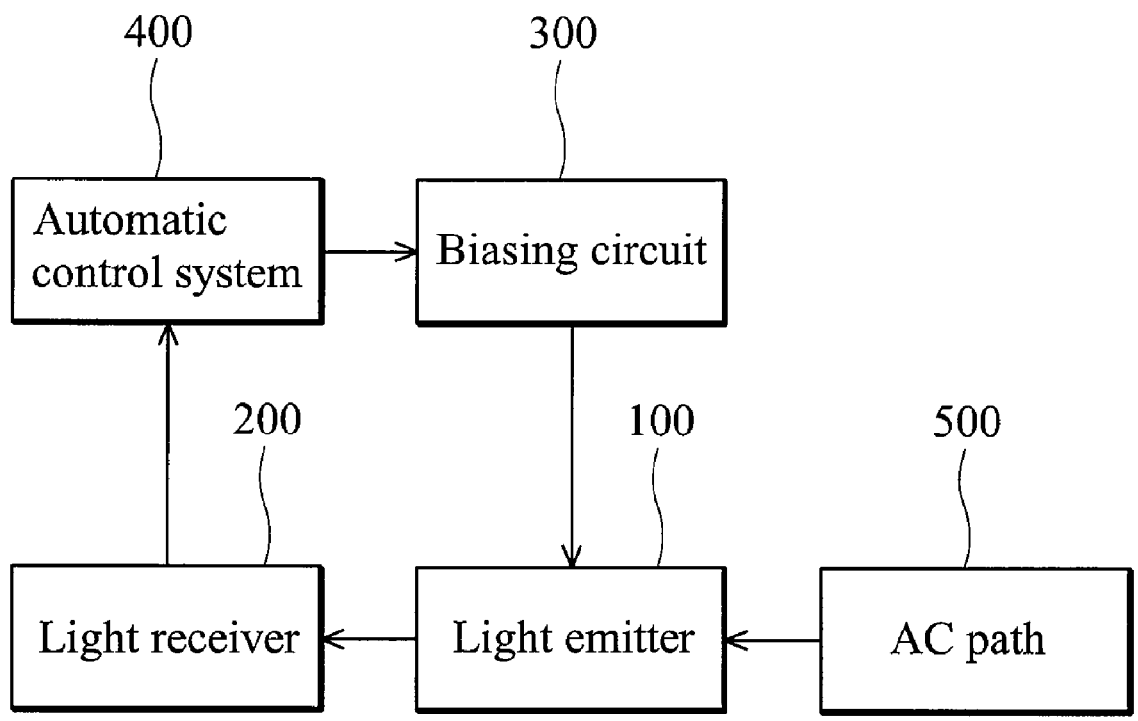
FIG. 2 is a block diagram of an exemplary embodiment of a driving device driving a laser diode of a phase measurement device.
Figure 3:
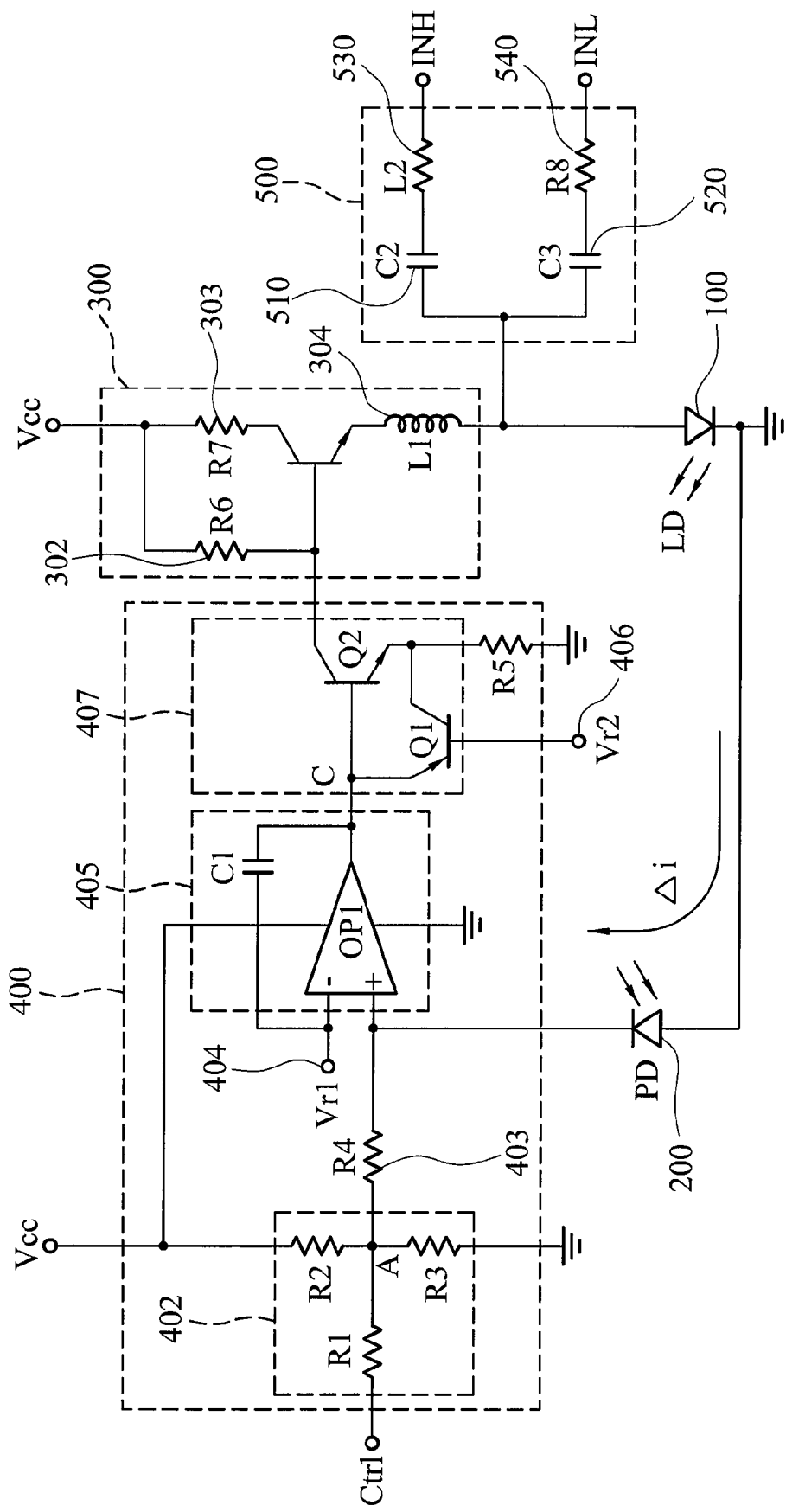
FIG. 3 is a schematic diagram of an exemplary embodiment of the driving device.

FIG. 2 is a block diagram of an exemplary embodiment of a driving device driving a laser diode of a phase measurement device. FIG. 3 is a schematic diagram of an exemplary embodiment of the driving device. With reference to FIG. 2 and FIG. 3, the driving device comprises a light emitter 100, a light receiver 200, a biasing circuit 300, an automatic control system 400, and an alternating current (AC) path 500.

Light emitter 100 is a laser diode (LD) for generating an optical signal. Light receiver 200 detects the optical signal output from light emitter 100 to generate a corresponding electronic signal. Generally, the receiving terminal of the light receiver is a photo transformer, such as APD or a photo diode (PD). The photo transformer generates an electronic signal corresponding to the received optical signal.

Biasing circuit 300 generates a driving signal to light emitter 100 such that light emitter 100 operates in a suitable working range. In this embodiment, light emitter 100 operates in a preset working range according to the driving signal provided by biasing circuit 300. Biasing circuit 300 at least comprises a switch element (Q3) 301, a sixth resistor (R6) 302, a seventh resistor (R7) 303, and a first inductor (L1) 304. Seventh resistor (R7) 303 is coupled between a first terminal (collector) of switch element (Q3) 301 and a power source (Vcc). Sixth resistor (R6) 302 is coupled between a second terminal (base) of switch element (Q3) 301 and the power source (Vcc). First inductor (L1) 304 is coupled between a third terminal (emitter) of switch element (Q3) 301 and light emitter 100. Light emitter 100 is coupled to first inductor (L1) 304 and a grounding terminal according to a forward bias type.

In this embodiment, switch element (Q3) 301 is an NPN bipolar junction transistor (BJT) or a power transistor for providing a driving current to light emitter 100. Sixth resistor (R6) 302 and seventh resistor (R7) 303 are switch elements for providing a suitable working point and avoiding higher current passing through light emitter 100. First inductor (L1) 304 is an isolation inductor for limiting the AC signal in AC path 500. Additionally, the voltage source (Vcc) exceeds 3.3V, but the disclosure is not limited thereto.

Automatic control system 400 controls biasing circuit 300 to adjust the driving signal according to the electronic signal provided by light receiver 200 such that the output power of the optical signal is stabilized at a preset value. Thus, a direct current (DC) part of the driving device is composed of biasing circuit 300 and automatic control system 400.

Automatic control system 400 comprises a first control signal (Ctrl) 401, a voltage divider 402 comprising a first resistor R1, a second resistor R2, and a third resistor R3, a first resistance 403, a first variable voltage (Vr1) 404, a integral loop 405 comprising an operation amplifier OP1 and a first capacitor C1, a second control signal (Vr2) 406, and a Darlington loop 407 comprising a first transistor Q1 and a second transistor Q2.

In this embodiment, the voltage of the first control signal (Ctrl) 401 determines whether to turn on light emitter 100. The first voltage $V_A$ of a point A is generated according to the first control signal (Ctrl) 401 and voltage divider 402. In other words, first resistor R1, second resistor R2, and third resistor R3 determine the first voltage VA. The third voltage $V_B$ of a point B is generated by the first voltage $V_A$ and first resistance 403 provided by a resistor R4.

The positive input of the operation amplifier OP1 is electrically connected to point B. The voltage of the positive input of the operation amplifier OP1 should equal that of the negative input of the operation amplifier OP. In other words, the third voltage $V_B$ of the point B is the same as first variable voltage (Vr1) 404. Thus, the first variable voltage (Vr1) 404 is controlled for changing the third voltage $V_B$ of the point B. The driving current driving light emitter 100 is determined according to the voltage difference between the points A and B and first resistance 403.

In this embodiment, the first voltage $V_A$ is adjusted according to first control signal (Ctrl) 401. The third voltage $V_B$ is adjusted according to first variable voltage (Vr1) 404. The driving current driving light emitter 100 is determined according to the first voltage $V_A$, the third voltage $V_B$, and first resistance 403. The output terminal C of integral loop 405 outputs a second voltage $V_C$.

Darlington loop 407 is coupled to the output terminal C of integral loop 405 and composed of first transistor Q1 and second transistor Q2. First transistor Q1 is a PNP BJT. Second transistor Q2 is a NPN BJT. The base of first transistor Q1 receives a second variable voltage (Vr2) 406. The amplification of Darlington loop 407 is changed when second variable voltage (Vr2) 406 is adjusted. Thus, the range of the driving current driving light emitter 100 is controlled.

The operating principle of the driving device is described in the following. Light receiver (PD) 200 receives a portion of the optical signal emitted from light emitter (LD) 100 for generating optical current Δi corresponding to the received optical signal. For example, when the output power of the optical signal emitted from light emitter (LD) 100 is higher, the optical current Δi generated by light receiver (PD) 200 is higher. The current passing through first resistance 403 is increased such that third voltage $V_B$ of point B is reduced. Thus, second voltage $V_C$ of point C is reduced for reducing the driving current. Because light emitter 100 is driven according to the driving current, when the driving current is reduced, the output power of the optical signal provided by light emitter 100 is also reduced.

Conversely, when the output power of the optical signal provided by light emitter (LD) 100 is reduced, the optical current Δi generated by light receiver (PD) 200 is also reduced. The current passing through first resistance 403 is reduced such that third voltage $V_B$ of point B and second voltage $V_C$ of point C are increased. Thus, the driving current is increased for increasing the output power of the optical signal provided by light emitter (LD) 100.

The output power of the optical signal changes because the driving device is too hot or due to environmental changes. Because light receiver 200, automatic control system 400, and biasing circuit 300 are utilized for automatically adjusting a driving signal according to the received optical signal, when light emitter 100 receives the adjusted driving signal, the output power of the optical signal is equal to a preset value. The driving signal provided by biasing circuit 300 is a current signal or a voltage signal.

Additionally, AC path 500 is coupled between light emitter 100 and an external signal source for receiving at least one AC modulated signal (INH and INL) such that light emitter 100 generates at least one modulated optical signal. In this embodiment, AC path 500 comprises a second capacitor (C2) 510, a third capacitor (C3) 520, a second inductor (L2) 530, and a second resistance (540) provided by resistor R8 and receives the AC modulated signals INH and INL. The disclosure is not limited to AC path 500 shown in FIG. 3.

One terminal of second capacitor (C2) 510 and that of third capacitor (C3) 520 are coupled to light emitter (LD) 100 and first inductor (L1) 304. Second inductor (L2) is connected to second capacitor (C2) 510 in series between light emitter (LD) 100 and AC modulated signal INH. Resistor R8 is connected to third capacitor (C3) 520 in series between light emitter (LD) 100 and AC modulated signal INL. The modulated signal INH is a high frequency signal and modulated signal INL is a low frequency signal.

In a distance measurement system, various phase measuring signals are required to increase accuracy, thus, various modulated signals are required. The modulated signals are from millions to hundreds of millions. A frequency synthesizer (not shown) within the distance measurement system generates corresponding modulated signals (INH and INL) according to control signals of processing unit. AC path 500 is coupled to the frequency synthesizer for transmitting the modulated signals to the input terminal (anode terminal) of light emitter 100.

Second capacitor (C2) 510 and second inductor (L2) 530 transmit modulated signal INH with higher frequency to light emitter 100. Third capacitor (C3) 520 and second resistance

540 transmit modulated signal INL with lower frequency to light emitter 100. Thus, light emitter 100 provides an optical signal according to modulated signals INH and INL. The optical signal changes between light and shade. The frequency of the change is the same as modulated signals. In this embodiment, the frequency of the modulated signal INH exceeds that of modulated signal INL. The frequency difference between the modulated signals INH and INL is approximately thousands, but the disclosure is not limited thereto.

In summary, when the laser diode is too hot or in response to environmental changes, the output power of a laser beam provided by a laser diode changes. The described driving device automatically adjusts the driving current according to the received laser beam such that light emitter 100 driven by the driving current provides a stable laser beam. Because AC path 500 provides modulated signals such that the described driving device is further applied to an optical storage field, a light reading field, and a light communication field While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A driving device, comprising:
a light emitter generating an optical signal;
a biasing circuit generating a driving signal to activate the light emitter such that the light emitter operates in a working range;
a light receiver detecting the output power of the optical signal for generating a corresponding electrical signal;
an automatic control system adjusting the driving signal according to the corresponding electrical signal such that the output power of the optical signal approaches a preset value; and
an alternating current (AC) path coupled between the light emitter and an external signal source for receiving at least one AC modulated signal such that the light emitter generates at least one modulated optical signal, wherein the AC path receives a plurality of AC modulated signals having different frequency such that the light emitter generates different modulated optical signals,
wherein the AC path comprises:
a first capacitor comprising a first terminal coupled to the light emitter and a second terminal;
a second capacitor comprising a first terminal coupled to the light emitter and a second terminal;
a first inductor comprising a first terminal coupled to the second terminal of the first capacitor and a second terminal receiving a first AC modulated signal; and
a first resistor comprising a first terminal coupled to the second terminal of the second capacitor and a second terminal receiving a second AC modulated signal.

2. The driving device as claimed in claim 1, wherein the light emitter is a laser diode.

3. The driving device as claimed in claim 1, wherein the light receiver is a photo diode.

4. The driving device as claimed in claim 1, wherein the frequency of the first AC modulating signal exceeds that of the second AC modulating signal.

5. The driving device as claimed in claim 1, wherein the biasing circuit comprises a switch element coupled between a power source and the light emitter, and wherein the switch element comprises a control terminal coupled to the an automatic control system.

6. The driving device as claimed in claim 5, wherein the switch element is a bipolar junction transistor (BJT).

7. The driving device as claimed in claim 5, wherein the biasing circuit further comprises:
a second resistor coupled between a first terminal of the switch element and the power source;
a third resistor coupled to the control terminal of the switch element and the automatic control system; and
a second inductor coupled between the switch element and the light emitter.

8. A driving method, comprising:
generating a driving signal to activate a light emitter such that the light emitter operates in a working range and generates an optical signal;
detecting the output power of the optical signal to generate a corresponding electrical signal;
adjusting the driving signal according to the corresponding electrical signal such that the output power of the optical signal approaches a preset value; and
utilizing an alternating current (AC) path to receive at least one AC modulated signal such that at least one modulated optical signal is generated by the light emitter, wherein the AC path is coupled between the light emitter and an external signal source, wherein a plurality of AC modulated signals having different frequencies respectively are received by the AC path such that a plurality of modulated optical signals are generated by the light emitter,
wherein the AC path is composed of a first capacitor, a second capacitor, a first inductor and a first resistor,
wherein the first capacitor comprises a first terminal coupled to the light emitter and a second terminal, the second capacitor comprises a first terminal coupled to the light emitter and a second terminal, the first inductor comprises a first terminal coupled to the second terminal of the first capacitor and a second terminal receiving a first AC modulated signal and the first resistor comprises a first terminal coupled to the second terminal of the second capacitor and a second terminal receiving a second AC modulated signal.

9. The driving method as claimed in claim 8, wherein the corresponding electrical signal is a current signal or a voltage signal.

10. A driving device for driving a laser diode, comprising:
a light emitter generating an optical signal;
a biasing circuit coupled to the light emitter for generating a driving signal such that the light emitter is activated by the driving signal and operates in a working range;
a light receiver detecting the output power of the optical signal for generating a corresponding electrical signal; and
an automatic control system coupled between the light receiver and the biasing circuit, wherein the automatic control system adjusts a current passing through the light emitter according to the corresponding electrical signal and comprises:
a voltage divider modulating a biasing voltage of the light emitter according to a first control signal;
an integral loop coupled to an output terminal of the voltage divider; and
an alternating current (AC) path coupled between the light emitter and an external signal source, wherein the AC path receives a first AC modulated signal and a second AC modulated signal such that the light emitter emits the optical signal according to at least one frequency, wherein the AC path comprises:

a first capacitor comprising a first terminal coupled to the light emitter and a second terminal;

a second capacitor comprising a first terminal coupled to the light emitter and a second terminal;

a first inductor comprising a first terminal coupled to the second terminal of the first capacitor and a second terminal receiving a first AC modulated signal; and a first resistor comprising a first terminal coupled to the second terminal of the second capacitor and a second terminal receiving a second AC modulated signal.

11. The driving device as claimed in claim 10, wherein the integral loop comprises a first variable voltage transmitted to a negative input of an operation amplifier for modulating a control current of the light receiver.

12. The driving device as claimed in claim 11, wherein a first resistance is coupled between the voltage divider and a positive input of the operation amplifier for generating a voltage drop between the voltage divider and the integral loop.

13. The driving device as claimed in claim 10, wherein the automatic control system further comprises a Darlington loop coupled between an output terminal of the integral loop and the biasing circuit.

14. The driving device as claimed in claim 13, wherein the Darlington loop comprises a second variable voltage for modulating an amplification of the Darlington loop.

15. The driving device as claimed in claim 10, wherein the biasing circuit at least comprises:

a switch element coupled between a power source and the automatic control system; and a first inductor coupled between the switch element and the light emitter.

16. The driving device as claimed in claim 1, wherein the AC path receives a first AC modulated signal and a second AC modulated signal and the frequency difference between the first and the second AC modulated signals is approximately thousands.

17. The driving method as claimed in claim 8, wherein the AC path receives a first AC modulated signal and a second AC modulated signal and the frequency difference between the first and the second AC modulated signals is approximately thousands.

18. The driving device as claimed in claim 10, wherein the AC path receives a first AC modulated signal and a second AC modulated signal and the frequency difference between the first and the second AC modulated signals is approximately thousands.

* * * * *